United States Patent
Farkas et al.

[11] Patent Number: 5,928,962
[45] Date of Patent: Jul. 27, 1999

[54] PROCESS FOR FORMING A SEMICONDUCTOR DEVICE

[75] Inventors: Janos Farkas; Sanjit K. Das; George R. Meyer, all of Austin, Tex.

[73] Assignee: Motorola, Inc., Schaumburg, Ill.

[21] Appl. No.: 09/088,013

[22] Filed: Jun. 1, 1998

[51] Int. Cl.[6] .................................................. H01L 21/00
[52] U.S. Cl. ........................................ 438/692; 438/693
[58] Field of Search ................................... 438/691, 692, 438/693

[56] References Cited

U.S. PATENT DOCUMENTS

| | | | |
|---|---|---|---|
| 4,944,836 | 7/1990 | Beyer et al. | 156/645 |
| 5,382,272 | 1/1995 | Cook et al. | 51/293 |
| 5,525,191 | 6/1996 | Marniar et al. | 156/636.1 |
| 5,527,423 | 6/1996 | Neville et al. | 156/636.1 |
| 5,710,069 | 1/1998 | Farkas et al. | 438/7 |
| 5,759,917 | 6/1998 | Grover et al. | 438/692 |
| 5,783,489 | 7/1998 | Kaufman et al. | 438/692 |
| 5,786,275 | 7/1998 | Kubo | 438/692 |

OTHER PUBLICATIONS

Sung Kim; U.S. Patent Application 08/780,113 filed Dec. 13, 1996.

*Primary Examiner*—Benjamin Utech
*Assistant Examiner*—Duy-Vu Deo
*Attorney, Agent, or Firm*—George R. Meyer

[57] ABSTRACT

Physical properties of alumina particles in a chemical-mechanical polishing slurry delivery loop (28) are measured using a titration technique (44). Examples of the physical properties include crystallographic phase, surface charge, and surface charge density. The physical properties are correlated to a polishing rate (46). Specification limits are generated using the correlated data (482 and 486). The specification limits are used to determine if no adjustments are required to the polishing parameters (484), if adjustments are required to polishing parameters (488) or if the slurry requires replacement (489). This process can be automated and integrated into a conventional chemical-mechanical polishing processing system (20).

23 Claims, 4 Drawing Sheets

PROCESS FOR FORMING A SEMICONDUCTOR DEVICE

RELATED APPLICATIONS

This is related to U.S. patent application Ser. No. 08/780,113, entitled "Process for Polishing a Semiconductor Device Substrate," filed on Dec. 13, 1996, and assigned to the current assignee hereof.

FIELD OF THE INVENTION

This invention relates in general to processes for forming semiconductor devices, and more particularly, to processes for forming semiconductor devices using a polishing step.

BACKGROUND OF THE INVENTION

Polishing substrates is becoming increasingly more common as semiconductor devices continue to shrink. In order to polish in a production environment, the polishing process needs to be characterized and controlled. Generally, film removal rate variations are more frequent with metal polishing processes. Variations are also observed with other post-polishing parameters including planarity, dishing erosion, recess, or the like. Sources of film removal rate variation include unstable tool parameters, degradation of the polishing pad, and variation in slurry properties.

Selectivity between the metal layer and an underlying insulating layer is typically achieved using alumina-based slurries. Alumina is typically a crystalline material that can have several crystallographic phases including alpha, beta, gamma, and delta phases. Bulk materials of each phase can exhibit different mechanical and sur face chemistry properties. FIG. 1 includes an illustration of a particle 10 within a slurry solution. The particle 10 has positive surface charges 12 that are countered by negative ions 14 within the solution. The zeta potential is the potential at the slippage plane 16 and may be positive or negative. Currently, some of the slurry properties monitored in semiconductor manufacturing include pH, solid content particle size, conductivity, and zeta potential. The prior art has been unsuccessful in providing a reliable correlation between the properties of the slurry abrasive materials and performance of the planarization processes.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

A surface charge or surface charge density of a chemical-mechanical polishing (CMP) slurry is measured and correlated to a CMP removal rate to determine if CMP process parameters should be adjusted to compensate for removal rate variations.

Figure 1:
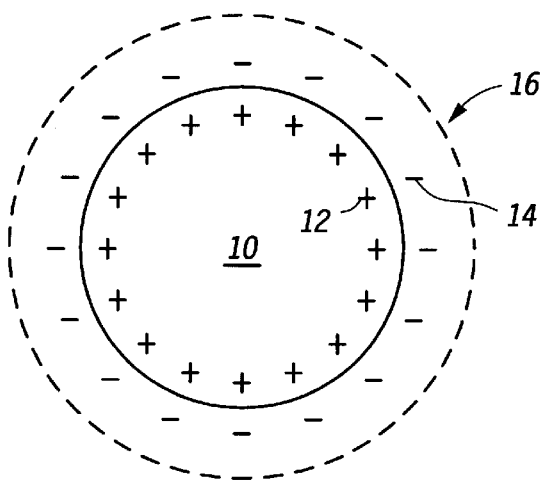
FIG. 1 includes an illustration of a cross-sectional view of a particle illustrating charges and a slippage plane (prior art)
Figure 2:
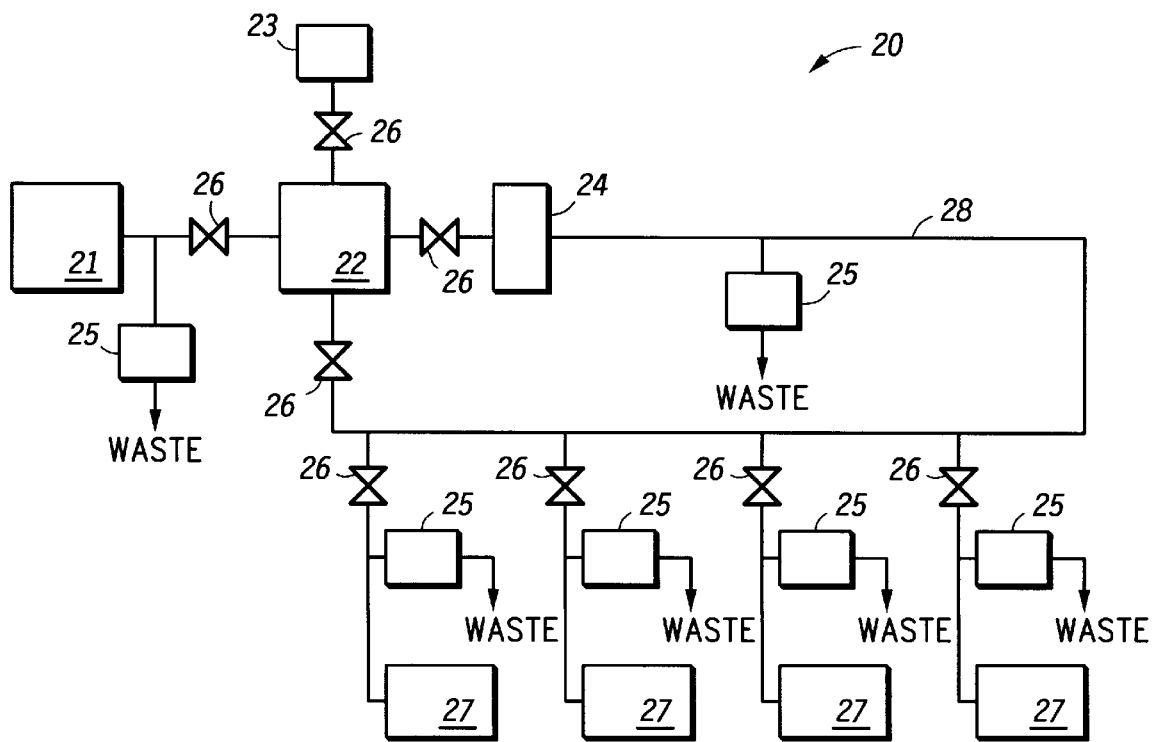
FIG. 2 includes a schematic diagram illustrating a slurry feed system for chemical-mechanical polishers.

FIG. 2 is a schematic diagram of a semiconductor manufacturing facility's slurry delivery system 20. Bulk chemicals are typically obtained from vendors in storage drums 21 having a volume of approximately 210 liters (55 gallons). The storage drum 21 supplies water and suspended particles to the slurry delivery system 20. In this embodiment, the slurry composition includes alumina particles and water with a particle concentration in a range of approximately 6–25% by weight solids content. In other embodiments, the slurry particles can be any other particles that are capable of having different phases, different crystallographic planes, non-spherical shapes, or rough or irregular surfaces exposed. A surface charge density (SCD) monitor 25 is tapped from the feed line going to a daily supply tank 22. Details of the SCD monitor 25 are described later in this specification. After analyzing a sample in the SCD monitor 25, it is sent to the facility's waste system.

Downstream from the SCD monitor 25 is an isolation valve 26 and a daily supply tank 22. Other isolation valves 26 isolate the daily supply tank 22 from the rest of the slurry delivery system 20. The isolation valves 26 can be any combination of gate valves, globe valves, or the like, and they can be controlled manually, pneumatically, or electrically. If necessary, the slurry can be diluted to the proper solids content using a diluting system 23. The diluent is typically water, although other solvents can be used. The diluent selected however, should not adversely react with the particles in the slurry or the plumbing within the system 20. After a proper formulation of slurry is prepared in the daily supply tank 22, it is circulated through a slurry delivery loop 28. The isolation valves 26 to the drum 21, to the diluting system 23, and to the individual polishing systems 27 are normally closed. The isolation valves 26 along the loop 28 are opened, and a recirculating system (pump) 24 is activated. The slurry flows around the loop 28 until reaching a substantially steady state condition. Located within the loop 28 is an SCD monitor 25 similar to the one located between storage drum 21 and daily supply tank 22. Its function is to sample and analyze the slurry at a point along the loop 28.

Polishing systems 27 are connected to the slurry delivery loop 28. After steady state circulation conditions within the slurry delivery loop have been achieved, corresponding isolation valves 26 are opened for each active polishing system 27. SCD monitors 25 are placed such that they are tapped off the lines between the isolation valves 26 and the polishing systems 27.

In FIG. 2, not all the SCD monitors 25 shown are required. For example, the SCD monitor 25 near the storage drum may be the only one used. Alternatively, an SCD monitor 25 may be used only in the delivery loop 28, or at one or more of the polishing systems 27. Any combination of the SCD monitors 25 can be used. The SCD monitors 25 are used to periodically sample the slurry. They do not necessarily operate continuously during the polishing process or continuously as slurry recirculates through the loop 28.

Figure 3:
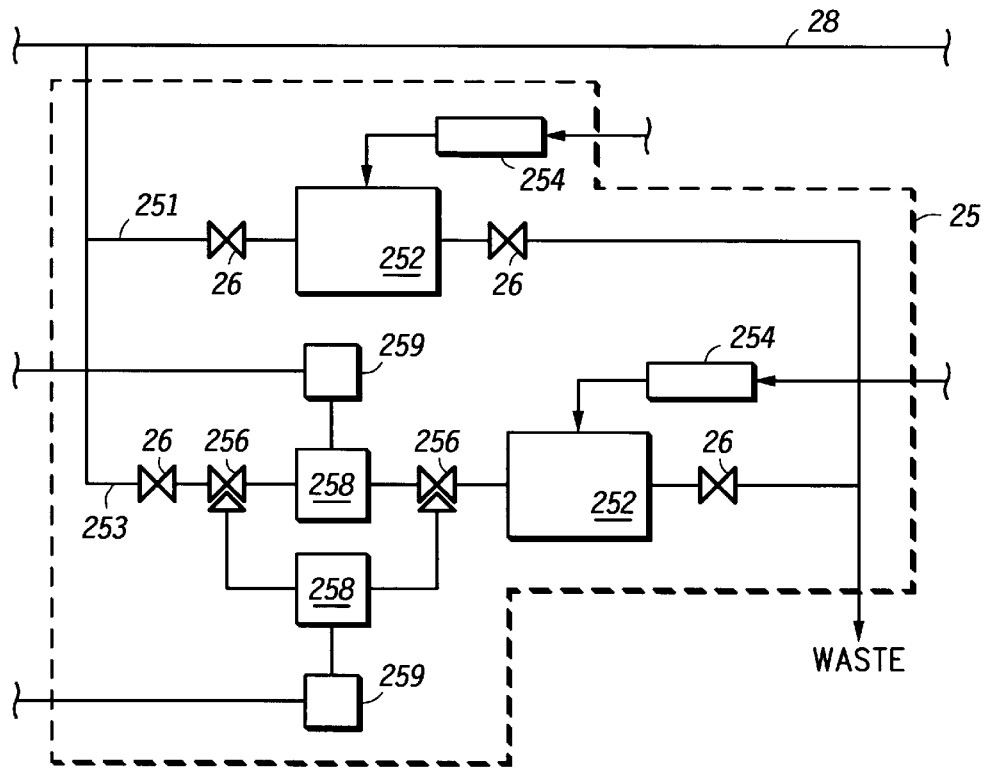
FIG. 3 includes a schematic diagram of a surface charge density monitor in accordance with an embodiment of the present invention.

FIG. 3 illustrates a portion of one of the SCD monitors 25. A sampling tap allows slurry from a delivery loop 28 to flow into the SCD monitor 25. Portions from a first stream 251 and a second stream 253 are sampled and analyzed. Each stream includes isolation valves 26, a sample cell 252, and an acid/base injection system 254. Typically, sample volumes are in a range of approximately 1–10 milliliters, although other sampling volumes can be used.

The sample analysis is performed using a known, predetermined volume that is accurately measured when it is drawn into sample cell 252. When analyzing the first stream 251, it first is titrated within the sample cell 252 using a titrant (an acid or base of a known concentration) provided by the injection system 254 until a predetermined (first) pH is reached. The pH can be monitored using a pH meter within the sample cell. After analysis of the first stream 251 is complete, the sample size, titrating volume and concentration, and resulting pH of the first stream are known or have been determined.

When analyzing the second stream 253, the sample is first filtered through a filtration system 258 to remove solids that correspond with alumina particles in the slurry.

The filtration system 258 has an associated pressure control system 259 that forces the sample through the filtration system 258. The pressure control system 259 can use a positive pressure, a negative pressure (vacuum), or a combination thereof to control sample displacement. A predetermined volume of filtrate from the filtration system 258, then flows into its associated sample cell 252, where it is titrated using the injection system 254 technique described for the first stream. The volume of the filtrate is substantially equal to the volume of the solution analyzed in the first stream 251. Once the analysis is complete, the sample size of the filtrate, titrating volume and concentration, and resulting pH of the second stream are known.

Since the volumes from the first stream 251 sample and filtrate are substantially equal, the volume of titrant from the second stream sample 253 can be subtracted from the volume of the titrant from the first stream sample 251 to obtain a volume difference. The volume difference is proportional to the surface charge density of the alumina particles in the slurry.

In FIG. 3, two filtration systems 258 and their associated pressure control systems 259 are shown in conjunction with two three-way valves 256. This configuration allows use of one filtration system 258 and its associated pressure control system 259 while the other filtration system 258 and its associated pressure control system 259 are being cleaned, repaired, or otherwise maintained.

Figure 4:
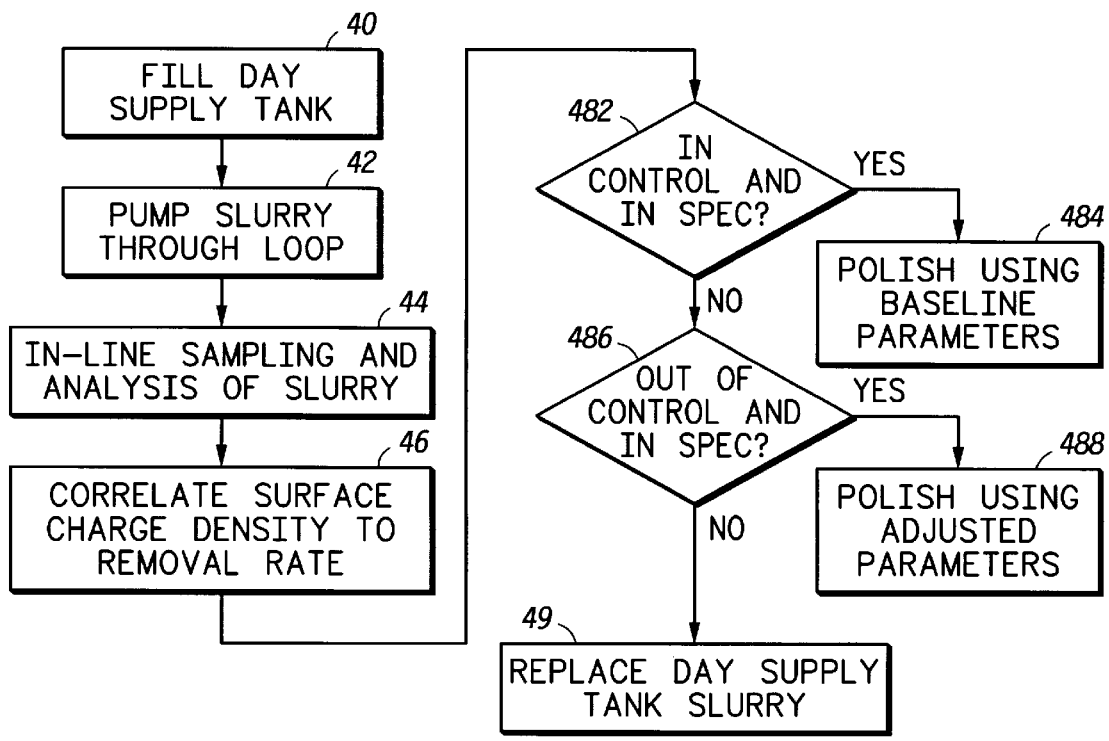
FIG. 4 includes a process flow diagram illustrating how the surface charge density measurement is used to adjust polishing conditions.

A specific embodiment is shown in a flow chart in FIG. 4 describing how the system can be used. In step 40, the daily supply tank is filled. In step 42, the slurry is pumped through the slurry delivery loop using the recirculating system. In step 44, in-line sampling and analysis are performed using the SCD monitor 25 and the apparatus described in FIG. 3 to determine the surface charge density, as opposed to the zeta potential. In step 46, unlike the prior art, the surface charge density is correlated to a CMP removal rate. This correlation will be described in more detail using FIG. 5. In step 482, a determination is made whether the CMP removal rate is within both specification limits and control limits. If so, polishing is performed (step 484) using baseline polishing parameters including polishing time, substrate down force pressure, linear velocity, or the like. If the CMP removal rate is within the specification limit but out of control (step 486), a polishing parameter including polishing time, substrate down force pressure, linear velocity, or the like is adjusted (step 488). Optionally, any combination of polishing parameters may be changed. If the CMP removal rate is outside of both specification and control limits, the slurry is discarded and replaced with a new batch (step 49).

Figure 5:
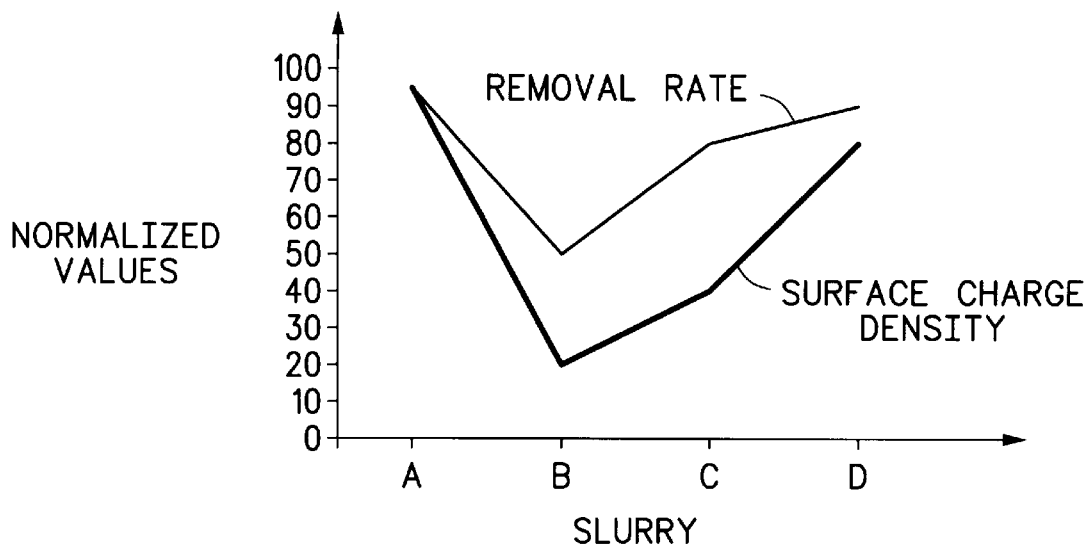
FIG. 5 includes a plot showing an effect of surface charge density on CMP removal rate.

FIG. 5 is a graph showing normalized surface charge density values and CMP removal rates for four different lots of substantially the same slurry. As indicated by FIG. 5, the CMP removal rate is directly proportional to changes in surface charge density. Increases and decreases in removal rate correspond with increases and decreases of the slurry's measured surface charge density. The results of the data shown by FIG. 5 indicate that the removal rate and surface charge density do not have a direct one-to-one proportional relationship with each other. However, the change in surface charge density is generally larger than the corresponding change in CMP removal rate.

The following example used the normalized surface charge density data in FIG. 5 for slurries A, B, C and D in conjunction with the flow chart in FIG. 4. If the control limit for measured surface charge density is 90% and the specification limit is 70%, the polishing parameters for Slurry A would not require adjusting because its measured surface charge density is above the 90% control limit. The polishing time of Slurry D on the other hand, could be adjusted to compensate for a reduced polish rate, because the measured surface charge of Slurry D is below the control limit but still above the specification limit. Slurry B and Slurry C however, are both rejected as unusable because the measured surface charges are below the 70% specification limit. In the case of these two batches, the slurry in the loop is changed for a new batch. This is just one example of how a slurry's surface charge density can be used to monitor the CMP removal rate.

Figure 6:
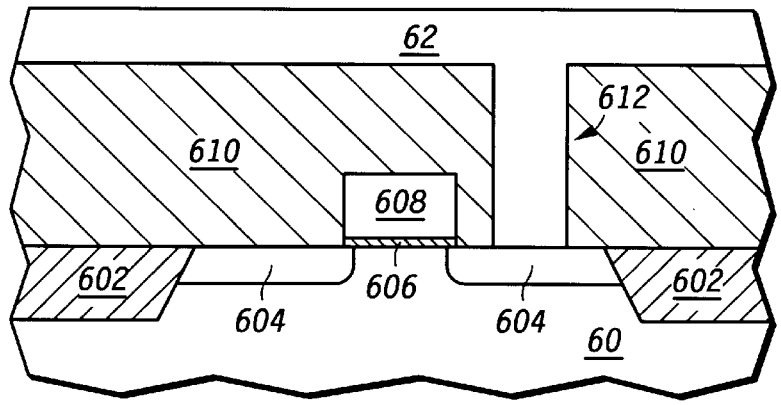
FIG. 6 includes an illustration of a cross-sectional view of a portion of a semiconductor device substrate before a polishing step.

The slurry feed system as illustrated and described can be used in the fabrication of semiconductor devices. FIG. 6 includes an illustration of a cross-sectional view of a semiconductor device during processing. A semiconductor device substrate (base material) 60 includes a monocrystalline semiconductor wafer, a semiconductor-on-insulating wafer, or any other substrate used in forming semiconductor devices. Field isolation regions 602 and doped regions 604 lie within the substrate 60. A gate dielectric layer 606 and a gate electrode 608 overlie the substrate 60 and portions of the doped regions 604. An interlevel dielectric layer 610 is formed over the gate electrode 608, doped regions 604, and field isolation regions 602. The layer 610 is planarized and patterned to define a contact opening 612. A conductive layer 62 is formed over the interlevel dielectric layer 610 and within the contact opening 612.

Some of the layers illustrated in FIG. 6 may include more than one film. For example, the gate electrode 608 may include a doped polysilicon film and a metal silicide film. The interlevel dielectric layer 610 may include a combination of doped and undoped oxides, or oxides formed by a non plasma assisted chemical vapor deposition and a plasma-enhanced chemical vapor deposition. The conductive layer 62 typically includes an adhesion/barrier film and a conductive fill material. In this particular embodiment the conductive layer 62 includes a titanium film, titanium nitride film, and a tungsten film. In other embodiments, other refractory metal materials (tantalum, tantalum nitride, or the like) or other conductive materials (aluminum, copper, or the like can be used). The adhesion/barrier film is relatively thin compared to the conductive fill material. Conventional processing steps are used to form the device up to this point in the process.

The substrate 60 is polished to remove portions of the conductive layer 62. In this embodiment, the conductive layer 62 includes tungsten and has a thickness in a range of approximately 400–800 nanometers. A porometric pad having a porometric thickness in a range of 330–590 microns (0.013–0.023 inches) is used to polish the substrate. An example of such a pad includes Politex™ pads available from Rodel, Inc. of Newark, Del. An aqueous alumina slurry from the loop 28 (shown in FIG. 2) and an aqueous ferric nitrate ($Fe(NO_3)_3$) solution (not shown) are fed into one of the polishing systems 27 (shown in FIG. 2). The solutions are mixed in the polishing system 27 to form the polishing slurry prior to the polishing slurry reaching the porometric pad and the substrate 60 within the polishing system 27.

The polishing slurry has a pH in a range of approximately 0.5–2.0. The substrate 60 is polished using a substrate down force pressure in a range of approximately 34–48 kilopascals (5–7 pounds per square inch). When polishing copper or other softer metals, the substrate down force pressure may be changed to a range of approximately 14–21 kilopascals (2–3 pounds per square inch). The platen linear velocity is in a range of approximately 0.3–2.0 meters per second. The polishing time is in a range of approximately 1.5–6.0 minutes per substrate. The other polishing parameters include those conventionally used and are not expected to substantially change.

The variables affecting CMP removal rate depend upon several parameters. The inventors have discovered that the surface charge density of an alumina-based slurry affects the CMP removal rate of the film being polished. Before the polishing step is performed, the surface charge density of the alumina slurry is determined using one of the SCD monitors 25 (shown in FIG. 2). The surface charge density is compared to a previously sampled surface charge density that has been correlated to a removal rate of a previously polished substrate having a same conductive layer 62. Prior to polishing the substrate 60, one or more of the polishing parameters (substrate down force pressure, linear velocity, polishing time, or the like) may then be adjusted, based on the relative surface charge density measurements. The following example describes this procedure using the surface charge density measurements obtained from two slurrys (Slurry A and Slurry D) in FIG. 5.

Prior to polishing a substrate using Slurry D, Slurry D's surface charge density is determined using one of the SCD monitors 25 shown in FIG. 2. The normalized surface charge density of Slurry D, as indicated by FIG. 5, is determined to be approximately 80%. This value corresponds to a normalized polish removal rate of approximately 90%. If the polish rate requirement, established previously by Slurry A, specified that a slurry's normalized surface charge density be 95% or greater, then an adjustment to one or more of the polishing parameters may be made to compensate for the relative difference in surface charge density measurements. In this embodiment, given a three minute polishing process, a polishing time adjustment of approximately 10–15% (18–27 seconds) is added to the process to compensate for the predicted lower polishing rate. The time adjustment is programmed or otherwise added to the process when processing subsequent substrates. This is just one example of how surface charge density can be used to determine process adjustments to compensate for changes in the polish removal rate. Additional parameters including substrate down force pressure, linear velocity, or the like may also be used to compensate for these changes.

Figure 7:
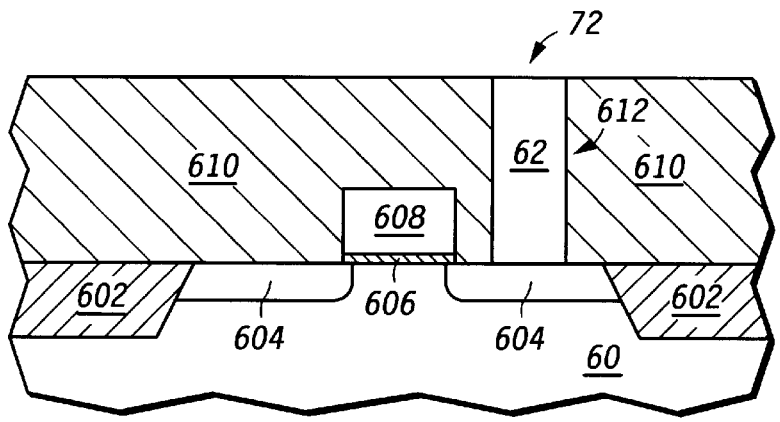
FIG. 7 includes an illustration of a cross-sectional view of the substrate of FIG. 6 after performing the polishing step.
Figure 8:
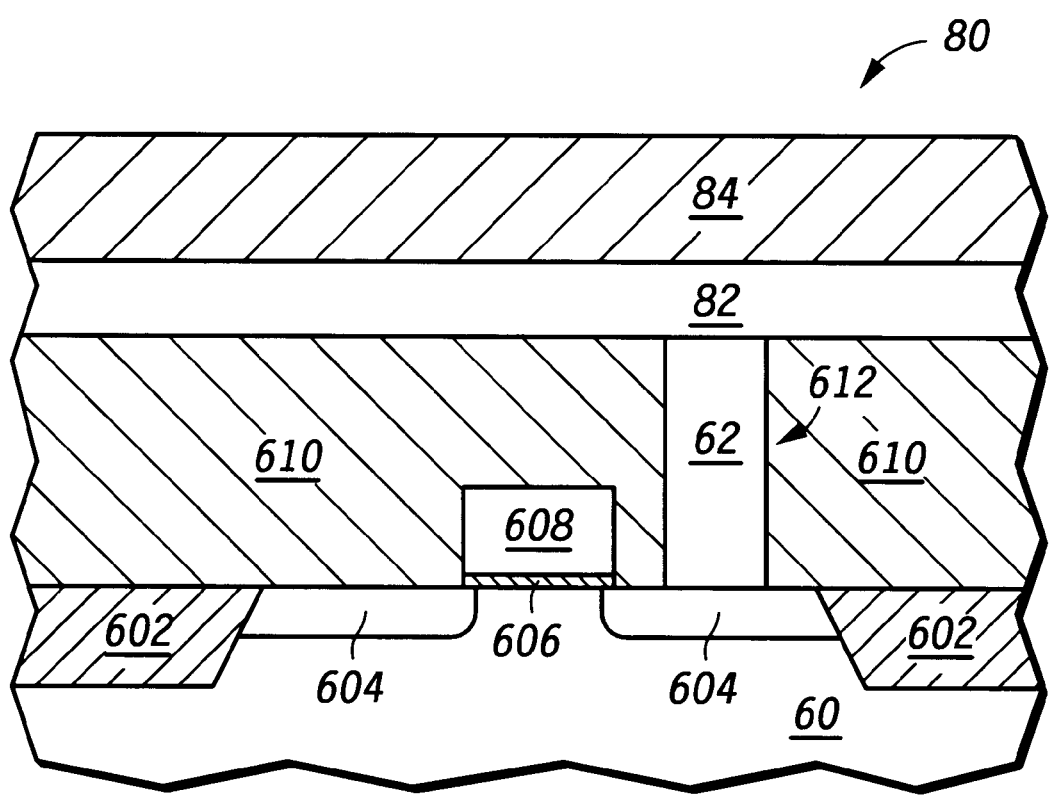
FIG. 8 includes an illustration of a cross-sectional view of the substrate of FIG. 7 after forming a substantially completed semiconductor device.

The substrate 60 is then polished to remove portions of the conductive layer 62 overlying the uppermost surface of the interlevel dielectric layer 610 to form a conductive plug 72 as shown in FIG. 7. Processing continues to form a substantially complete device 80 as shown in FIG. 8. An interconnect layer 82 is formed, and a passivation layer 84 is formed over the uppermost interconnect level. Although not illustrated in FIG. 8, other electrical connections are made to the device 80 including electrical connections to the gate electrode 608 and the other doped region 604. Additionally, other interlevel dielectric layers and interconnect levels may be formed as needed to form this substantially completed device.

Although the embodiments of the present invention have been described with respect to surface charge density, other parameters may be responsible for affecting CMP removal rates. In FIG. 5, the surface area of the alumina particles was assumed to be constant when determining the surface charge density. Surface charge, as opposed to surface charge density however, may also impact the CMP removal rate. The surface charge and corresponding surface charge density (charge/unit area), at least in part, determine how active the particles in the slurry are during polishing. Higher activity levels are expected to cause higher polish removal rates. Highly irregular shaped particles may have a larger surface charge as a result of their increased surface area. In this case, the surface charge density would be lower, however the overall surface charge would be higher and so would the corresponding polish removal rate.

The number and type of available chemical bonding sites at the particle's surface may also impact the CMP removal rate. Alumina has four separate phases, each corresponding to different crystallographic orientations. Each orientation has a different density of dangling bonds at the surface, as well as different types of species available for bonding (aluminum or oxygen atoms) at the surface. The different phases are believe to correspond to different surface activity levels that can affect the CMP removal rate. If the concentration of the more active phase(s) is controlled relative to the less active phase(s), the CMP removal rate can also be controlled. For example, if the concentration of the more active phase(s) increased, the corresponding CMP removal rate will also increase. Finally, by maintaining a relatively constant ratio of the phases within the slurry, the CMP removal rate may also be more reproducible from batch to batch (for the daily supply tank 22 shown in FIG. 2).

Embodiments allow adjustment of a polishing process that will reduce the overall polishing time, and also reduce the number of re-polishes typically required in a manufacturing environment. The likelihood of scraping or reworking wafers is greatly reduced while system throughput remains high. Although the previous embodiments have been described with respect to conductive layers, the same concepts can be carried over to polishing insulating layers.

While the zeta potential may be adequate for slurry particles having amorphous structures, embodiments of the present invention are highly useful when using abrasives that have crystallographic orientations (crystalline and polycrystalline) or different phases.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Further advantages and benefits of specific embodiments should not be construed to apply to those particular embodiments, and any particular advantage or benefit should not be construed as an essential element for any or all the claims. In the claims, means-plus-function clause(s), if any, cover the structures described herein that perform the recited function(s). The mean-plus-function clause(s) also cover structural equivalents and equivalent structures that perform the recited function(s).

We claim:

1. A process for forming a semiconductor device comprising the steps of:

providing a substrate having a first layer overlying a base material;

providing a solution, said solution having particles, each of said particles having a surface charge;

measuring said surface charge of said particles to determine a measured surface charge;

correlating said measured surface charge to a removal rate to determine a polishing parameter; and polishing said first layer with said solution using said polishing parameter.

2. The process of claim 1, wherein said measuring step further comprises steps of:

determining a first amount of a titrant needed to achieve a first pH value of said solution;

determining a second amount of said titrant needed to achieve said first pH value of a filtrate, wherein said filtrate has substantially fewer of said particles in said solution; and comparing said first amount to said second amount to calculate an amount difference, wherein said amount difference is used to determine said measured surface charge.

3. The process of claim 2, wherein said first pH value is in a range of about 8–10.

4. The process of claim 2, wherein said titrant is a material selected from the group consisting of KOH, $HNO_3$, NaOH, HCL, and $H2SO_4$.

5. The process of claim 2, wherein said titrant is ammonium hydroxide.

6. The process of claim 1, wherein said step of correlating further comprises the steps of:

determining specification limits for said measured surface charge density; and comparing said measured surface charge to said specification limits.

7. The process of claim 6, wherein the step of comparing further comprises the steps of:

determining an adjustment amount for said polishing parameter, wherein determining is based at least in part on information from the step of comparing; and adjusting said polishing parameter by said adjustment amount.

8. The process of claim 7, wherein said polishing parameter is selected from the group consisting of downforce pressure, linear velocity, and time.

9. The process of claim 1, wherein said particles exist in at least two crystallographic phases, wherein a first crystallographic phase has a first surface charge and a second crystallographic phase has a second surface charge, said second surface charge is greater than said first surface charge, and said solution uses particles having said second crystallographic phase.

10. A process for forming a semiconductor device comprising the steps of:

providing a substrate having a first layer overlying a base material;

providing a solution, said solution having particles, each of said particles having a surface charge density;

measuring said surface charge density of said particles to determine a measured surface charge density;

correlating said measured surface charge density to a removal rate to determine a polishing parameter; and polishing said first layer with said solution using said polishing parameter.

11. The process of claim 10, wherein said measuring step further comprises the steps of:

determining a first amount of a titrant needed to achieve a first pH value of said solution;

determining a second amount of said titrant needed to achieve said first pH value of a filtrate, wherein said filtrate has substantially fewer of said particles in said solution; and comparing said first amount to said second amount to calculate an amount difference, wherein said amount difference is used to determine said measured surface charge density.

12. The process of claim 11, wherein said first pH value is in a range of about 8–10.

13. The process of claim 11, wherein said titrant is a material selected from the group consisting of KOH, $HNO_3$, NaOH, HCL, and $H2SO_4$.

14. The process of claim 11, wherein said titrant is ammonium hydroxide.

15. The process of claim 10, wherein said step of correlating said measured surface charge density further comprises the steps of:

determining specification limits for said measured surface charge density; and comparing said measured surface charge to said specification limits.

16. The process of claim 15, wherein the step of comparing further comprises the steps of:

determining an adjustment amount for said polishing parameter, wherein determining is based at least in part on information from the step of comparing; and adjusting said polishing parameter by said adjustment amount.

17. The process of claim 16, wherein said polishing parameter is selected from the group consisting of downforce pressure, linear velocity, and time.

18. The process of claim 10, further comprising the steps of:

forming an interconnect layer over the substrate; and forming a passivation layer over the interconnect layer after said step of polishing.

19. A process for forming a semiconductor device comprising the steps of:

providing a substrate having a metal-containing layer overlying a base material;

flowing a solution through a processing system, said solution having particles, each of said particles having a surface charge;

measuring said surface charge of said particles from said processing system to determine a measured surface charge; and polishing said metal-containing layer using said solution.

20. The process of claim 19, wherein:

said step of flowing further comprises steps of:
providing a supply tank containing said solution;
simultaneously moving said solution from said supply tank to a delivery loop and to an in-line measuring system; and
said step of measuring is performed using said inline measuring system.

21. The process of claim 19, wherein said step of measuring further comprises the steps of:
determining a first amount of a titrant needed to achieve a first pH value of said solution;
determining a second amount of said titrant needed to achieve said first pH value of a filtrate, wherein said filtrate has substantially fewer of said particles in said solution; and
comparing said first amount to said second amount to calculate an amount difference, wherein said amount difference is used to determine said measured surface charge.

22. The process of claim 21, wherein said step of measuring further comprises:

a step of simultaneously moving said solution through a first stream and a second stream, wherein:
said step of simultaneously moving said solution through said first stream includes steps of:
placing a known volume of said solution in a first sample cell;
titrating said solution in said first sample cell with said titrant;
measuring said first amount of said titrant needed to achieve said first pH value;
said step of simultaneously moving said solution through said second stream includes steps of:
filtering said solution through a first filtering cell to obtain said filtrate;
titrating a volume of said filtrate substantially equal to said known volume of said solution, wherein said volume of filtrate is in a second sample cell with said titrant; and
measuring said second amount of said titrant required to achieve said first pH value.

23. The process of claim 22, further comprising the step of diverting said second stream through a second filtering cell, to obtain said filtrate.

* * * * *